US006892061B2

United States Patent
Asam

(10) Patent No.: US 6,892,061 B2
(45) Date of Patent: May 10, 2005

(54) MIXER CIRCUIT CONFIGURATION

(75) Inventor: Michael Asam, Wollomoos (DE)

(73) Assignee: Infineon Technologies AG, Munich (DE)

( * ) Notice: Subject to any disclaimer, the term of this patent is extended or adjusted under 35 U.S.C. 154(b) by 728 days.

(21) Appl. No.: 09/919,229

(22) Filed: Jul. 31, 2001

(65) Prior Publication Data

US 2002/0013137 A1 Jan. 31, 2002

(30) Foreign Application Priority Data

Jul. 31, 2000 (DE) .......................................... 100 37 247

(51) Int. Cl.$^7$ ............................................. H04B 15/00
(52) U.S. Cl. ...................... 455/313; 455/315; 455/314; 455/319; 455/326; 455/333; 327/113; 327/358; 327/359; 327/411
(58) Field of Search ................................. 455/313, 209, 455/314, 315, 319, 326, 333; 327/113, 358, 359, 411

(56) References Cited

U.S. PATENT DOCUMENTS 5,570,056 A * 10/1996 Groe ........................... 327/359
5,933,771 A * 8/1999 Tiller et al. .................. 455/333
6,026,286 A * 2/2000 Long ........................... 455/327

FOREIGN PATENT DOCUMENTS

| DE | 37 42 537 A1 | 7/1988 |
| DE | 41 14 943 A1 | 11/1991 |
| DE | 42 05 486 A1 | 12/1992 |

* cited by examiner

Primary Examiner—Lester G. Kincaid
Assistant Examiner—Minh D. Dao
(74) Attorney, Agent, or Firm—Laurence A. Greenberg; Werner H. Stemer; Gregory L. Mayback

(57) ABSTRACT

A circuit configuration for mixing a differential desired signal with a differential local oscillator signal includes two difference amplifiers which are controllable on the input side by the desired signal and cross-coupled on the output side. Currents flowing through the difference amplifiers are switched by the components of the local oscillator signal in alternation. The circuit makes a lower supply voltage possible, given the presence of only two transistor levels.

6 Claims, 2 Drawing Sheets

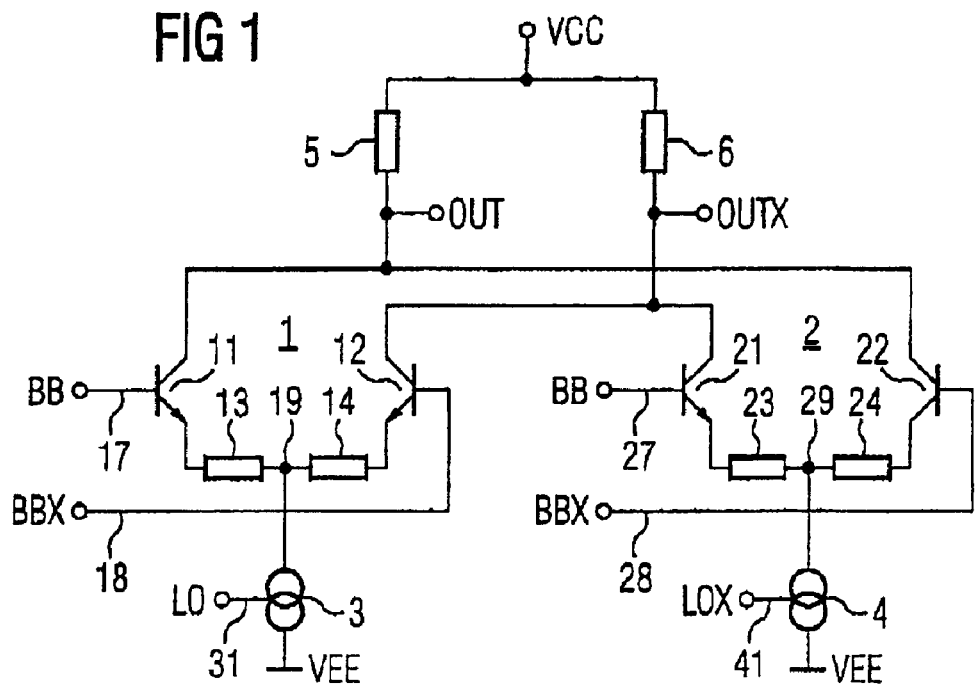
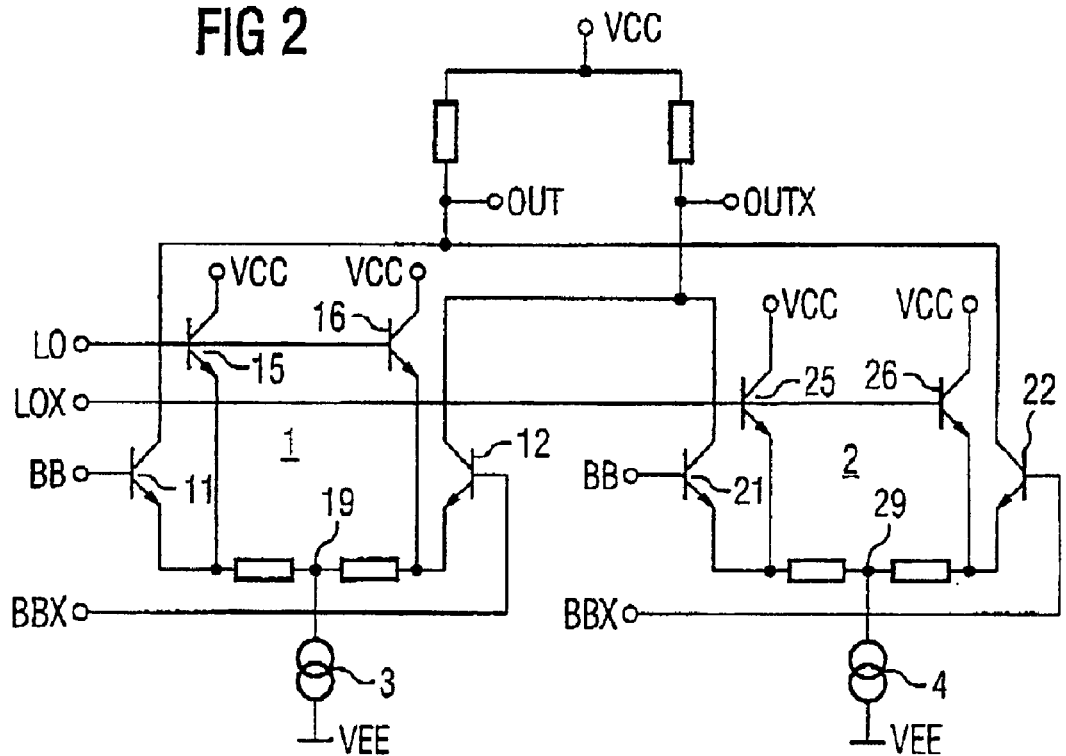

MIXER CIRCUIT CONFIGURATION

BACKGROUND OF THE INVENTION

Field of the Invention

The invention relates to a circuit configuration for mixing a desired signal with an oscillator signal, including terminals for complementary components of the desired signal and complementary components of the oscillator signal, which control difference amplifiers.

Circuit configurations for mixing a desired signal with an oscillator signal are frequently used in communication and messaging technology to convert desired signals from one frequency band into another. In particular, received high-frequency signals must be converted to an intermediate-frequency signal or vice versa.

A Gilbert mixer is normally used for that purpose. The desired signal, which includes complementary signal components, is fed to the Gilbert mixer at base terminals of two bipolar transistors which are emitter-coupled by way of a resistor. At the emitter side, the transistors are connected to reference potential (ground) by way of respective current sources. Respective difference amplifiers which are connected at the collector side have transistors controlled by the complementary signal components of the local oscillator signal and collector paths that are cross-coupled. The collector paths are connected to a positive supply potential by way of respective load resistors. The complementary signal portions of the output signal are tapped at the load resistors.

In conventional Gilbert mixers, a current source, the transistor which is controlled by the desired signal, the transistor which is controlled by the local oscillator signal, and the load element are connected in series between the terminals for the supply voltage. There are at least three transistor levels, taking into account that the current source also contains a transistor. The problem therewith is that the applied supply voltage must not fall below a minimum value. Moreover, the desire for an optimally low supply voltage is at odds with the desire for an optimally high amplitude of the output signal.

German Published, Non-Prosecuted, Patent Application DE 42 05 486 A1 teaches a mixer configuration in which two current switches are cross-coupled on the output side and controlled on the input side in a parallel manner. The current sources of the current switches are connected to the supply voltage by way of respective additional transistors, which are controllable by a digital signal.

German Published, Non-Prosecuted, Patent Application DE 41 14 943 A1 teaches a mixer having cascading current switches, in which the current switch that is connected to the current source contains transistors which are controllable by a frequency signal and which are connected to a current source on the reference potential side by way of respective resistors.

German Published, Non-Prosecuted, Patent Application DE 37 42 537 A1, corresponding to U.S. Pat. No. 4,766,400, teaches various four-quadrant Gilbert modulators including current sources on the reference potential side and a difference amplifier. The branches of the difference amplifier are coupled by way of resistors.

SUMMARY OF THE INVENTION

It is accordingly an object of the invention to provide a circuit configuration for mixing a desired signal with an oscillator signal, which can be operated given optimally low supply voltage and which overcomes the hereinafore-mentioned disadvantages of the heretofore-known devices of this general type.

With the foregoing and other objects in view there is provided, in accordance with the invention, a circuit configuration for mixing a desired signal with an oscillator signal, comprising terminals for the desired signal to be supplied with a first signal component and a complementary second signal component of the desired signal, and terminals for the oscillator signal to be supplied with a first signal component and a complementary second signal component of the oscillator signal. First and second difference amplifiers each include a coupling node and first and second branches. The branches each have first and second terminals and a transistor. Resistors each have a first terminal connected to the first terminal of a respective one of the branches and a second terminal connected to a respective one of the coupling nodes. Current sources are each connected between a respective one of the coupling nodes and a terminal for a reference potential. The transistors of the first branches of the difference amplifiers have control terminals controlled by the first component of the desired signal. The transistors of the second branches of the difference amplifiers have control terminals controlled by the second component of the desired signal. Load elements each connect the second terminal of the first branch of one of the difference amplifiers and the second terminal of the second branch of another of the difference amplifiers together to a terminal for a supply potential. Additional transistors can each be controlled by a respective one of the signal components of the oscillator signal. The additional transistors are each connected between the terminal for the supply potential and the first terminal of a respective one of the resistors of the branches of the difference amplifiers.

With the objects of the invention in view, there is also provided a circuit configuration for mixing a desired signal with an oscillator signal, comprising terminals for the desired signal to be supplied with a first signal component and a complementary second signal component of the desired signal, and terminals for the oscillator signal to be supplied with a first signal component and a complementary second signal component of the oscillator signal. First and second difference amplifiers each include a coupling node and first and second branches. The branches each have first and second terminals and a transistor. Resistors each have a first terminal connected to the first terminal of a respective one of the branches and a second terminal connected to a respective one of the coupling nodes. Current sources are each connected between a respective one of the coupling nodes and a terminal for a reference potential. Each of the current sources is a switchable current source with an impressible current to be controlled in dependence upon a respective one of the components of the oscillator signal. The transistors of the first branches of the difference amplifiers have control terminals controlled by the first component of the desired signal, and the transistors of the second branches of the difference amplifiers have control terminals controlled by the second component of the desired signal. Load elements each connect the second terminal of the first branch of one of the difference amplifiers and the second terminal of the second branch of another of the difference amplifiers together to a terminal for a supply potential.

The mixer according to the invention has only two transistor levels, which are connected between the supply voltage. The difference amplifiers are connected to reference potential (ground) by way of a current source. On the collector side, the difference amplifiers are connected to the supply voltage by way of the load element. Not only is the required minimum supply voltage lower as compared to a conventional Gilbert mixer, but the required number of transistors is lower as well.

As opposed to a conventional Gilbert mixer, a functional principle of the circuit according to the invention is that the current flowing through the difference amplifier transistors which are controlled by the desired signal is switched in dependence upon the oscillator signal. By contrast, in a Gilbert mixer the transistors which are controlled by the desired signal continuously have current flowing therethrough. Instead of the vertical structure of a Gilbert mixer, the mixer according to the invention has rather a horizontal structure, wherein the difference amplifiers which are controlled by the desired signal are controlled parallel to one another on the input side and merged at the load resistors on the collector side upon being coupled antiparallel to one another or cross-coupled. On the input side (with reference to the desired signal being mixed), the difference amplifiers are connected parallel to one another, and on the output side the collector branches of the difference amplifiers are connected antiparallel to each other and cross-coupled. In other words, a branch of a difference amplifier which is actuated by a first signal component of the desired signal is coupled with the branch of the other difference amplifier which is controlled by the other component of the desired signal.

In accordance with another feature of the invention, the two branches of the difference amplifiers are each connected to a coupling node, which is connected to the terminal for the reference potential, namely ground, by way of a current source. In one embodiment of the invention, the current sources are controllable. The magnitude of the impressed current is controlled by one of the respective complementary components of the oscillator signal. With a substantially digital oscillator signal, the currents which are provided by the current sources are switched on and off. The two current sources are switched on and off in opposite phases, i.e. in alternation. Depending on the operational sign of the oscillator signal component controlling the current source, the phase of the linear signal at the output is rotated 0° or 180°. This corresponds to the comparable mixing process in a Gilbert mixer.

In accordance with a further feature of the invention, it is also possible to connect a difference amplifier to the terminal for the reference potential by way of a constant current source and to provide a current path inside the difference amplifier which leads to the terminal for the supply potential. This bypass current path is controllable by one of the components of the oscillator signal in order to conduct the current past the difference amplifier branch transistors which are controlled by the desired signal and directly to the terminal for the supply potential. This is expediently accomplished by providing an additional transistor for each of the branches of the difference amplifier, having a main current path which is connected to the main current path of one of the transistors of the difference amplifier branch as well as to the terminal for the supply potential. This embodiment exhibits a particularly rapid switching behavior with respect to making and breaking the current which is deliverable to the transistors of the difference amplifier. The circuit can therefore be operated given high oscillator signal frequencies. The bypass transistors are emitter follower transistors (or source follower transistors in a realization which includes MOS transistors) in relation to the component of the oscillator signal controlling them, which raise the emitter potential (source potential) of the transistors that are controlled by the desired signal and thus block them. The current which is impressed by the constant current source is then redirected from the transistors of the difference amplifier branches, which transistors are controlled by the desired signal, to the current paths formed by the emitter follower (source follower). The rapid switching of the current gives rise to beneficial noise characteristics of the generated output signal.

In accordance with an added feature of the invention, the base points of the two difference amplifiers, i.e. the coupling nodes of the branches of the difference amplifiers, form a common node which is connected to the terminal for the reference potential by way of a common current source. The respective current sources of the difference amplifiers are thus formed by a single current source. In addition, the components of the local oscillator signal are connected to the control terminals of the transistors of the difference amplifiers by way of respective capacitive elements. The respective transistors of one difference amplifier then function as bypass transistors of the other difference amplifier. This has the advantage of ensuring that only a single current source is still needed, which saves current and lost power. Furthermore, fewer transistors are needed. The base terminals of the transistors, which are coupled to each other in this development, are decoupled from one another by way of respective resistors. Inductors can be provided instead of the resistors. The components of the oscillator signal are then supplied by coupled coils (transformers) instead of capacitive elements.

In accordance with a concomitant feature of the invention, the load elements contain active components, so that a mixer with variable amplification is formed. A load element includes an additional difference amplifier which has a base point that is connected to the coupled branches of the other difference amplifiers and which includes an additional load element on the load side in one of its branches, that is connected to the terminal for the supply potential. The two other branches of these load-side difference amplifiers are coupled to each other and connected to the terminal for the supply potential. A control signal which effectuates a parallel control of the branches of these difference amplifiers, that correspond to each other in pairs, serves for variably adjusting the amplification of the mixer. Since only two transistor levels are required for the mixer cell itself, the addition of the third transistor level for the variable amplification adjustment does not necessitate a higher supply voltage relative to a Gilbert cell. The circuit can be operated with a typical supply voltage of 2.7 volts.

Other features which are considered as characteristic for the invention are set forth in the appended claims.

Although the invention is illustrated and described herein as embodied in a mixer circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic diagram of a circuit according to a first embodiment of the invention;

FIG. 2 is a schematic diagram of a circuit according to a second embodiment including bypass emitter follower transistors;

DESCRIPTION OF THE PREFERRED EMBODIMENTS

Figure 3:
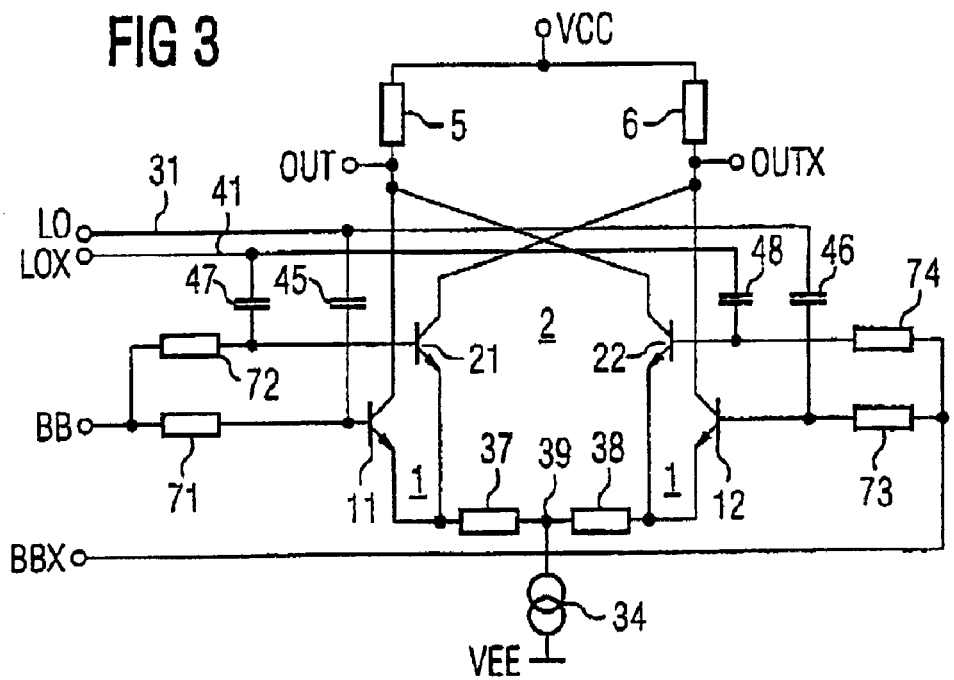
FIG. 3 is a schematic diagram of an embodiment including a single current source.

Referring now to the figures of the drawings in detail and first, particularly, to FIG. 1 thereof, there is seen a representation of a four-quadrant mixer which includes input terminals 17, 18, 27, 28 for a desired or wanted signal BB, BBX that must be mixed with an oscillator signal LO, LOX. The differential desired or payload signal includes complementary components BB and BBX. An in-phase component BB is provided at the terminals 17, 27 and an out-of-phase component BBX is provided at the terminals 18, 28. The oscillator signal is a differential signal including an in-phase component LO and out-of-phase component LOX, which are provided at respective terminals 31 and 41. A difference amplifier 1 includes signal paths in the form of bipolar transistors 11, 12 which have first terminals coupled with one another at a coupling node 19. A difference amplifier 2 includes signal paths in the form of bipolar transistors 21, 22 which are coupled with one another at a coupling node 29. Each difference amplifier branch includes a main current path of a respective transistor. The main current paths of bipolar transistors are their collector-emitter channels. Respective resistors 13, 14, which have first terminals provided on the emitter side, have second terminals connected to one another at the node 19. The node 19 is a base point of the difference amplifier 1, which is connected to a reference potential VEE, that can be ground, by way of a current source 3. A corresponding structure which is provided for the difference amplifier 2 includes two negative feedback resistors 23, 24 in the emitter paths of the two bipolar transistors 21, 22, the coupling node 29, and a current source 4 which connects the coupling node 29 or base point to ground. One of the transistors of the difference amplifiers, for instance the transistors 11, 21, is controlled by the signal component BB, whereas the other transistor, e.g. the transistors 12, 22, is controlled by the signal component BBX. The difference amplifiers 1, 2 are thus connected parallel to one another on the input side.

Collector paths or second terminals of the branches of the difference amplifiers are cross-coupled or connected antiparallel to each other. The collector of the transistor 11 of the difference amplifier 1, which is a transistor that is controlled by the signal BB, is thus connected at a coupling node to the collector of the transistor 22 of the difference amplifier 2, which is a transistor that is controlled by the signal BBX. The collectors of the transistors 12, 21 are coupled in a corresponding manner at a coupling node. These coupling nodes on the output side are connected by way of respective load resistors 5, 6 to a terminal for a supply potential VCC, which is positive relative to the ground potential VEE. An output terminal for an in-phase component OUT is connected to the resistor 5, and an output terminal for an out-of-phase component OUTX is connected to the resistor 6. The current sources 3, 4 are controllable current sources, i.e. their impressed current is adjustable in dependence upon a control signal. Thus, the current source 3 is controlled by the local oscillator signal LO at the terminal 31, and the current source 4 is controlled by the local oscillator signal LOX at the terminal 41, which has the opposite phase.

The difference amplifier 1 or the difference amplifier 2 is supplied with current in an alternating manner by alternating switching of the current sources 3, 4 on and off through the use of substantially rectangular digital signal components of the local oscillator signal LO, LOX. The differential signal components BB, BBX of the linear analog desired signal are thus mixed with the local oscillator signal LO, LOX, converted by the frequency of the local oscillator signal, and outputted as the output signal OUT, OUTX. Only one of the current sources is active. The phase of the linear signal at the output is rotated 0° or 180°, depending on the position of the operational sign of the LO/LOX signal relative to the linear input signal BB/BBX. In essence, the difference amplifiers 1, 2 are connected parallel to each other on the input side and antiparallel to each other on the output side, and the local oscillator signal changes over between the current sources which supply the difference amplifiers.

The circuit includes only two transistor levels: On one hand, a transistor level formed by the transistors 11, 12, 21, 22, and on the other hand a level formed by transistors contained in the current sources 3, 4. On one hand, the voltage between ground VEE and the positive supply potential VCC can thus be selected to be relatively low. On the other hand, there is enough reserve voltage to ensure that a sufficiently large amplitude of the differential output signal can be provided at the load resistors 5, 6.

As in FIG. 1, the embodiment represented in FIG. 2 includes the difference amplifiers 1, 2 having base points 19, 29 that are connected to ground by way of the current sources 3, 4. Unlike the embodiment shown in FIG. 1, the current sources 3, 4 of FIG. 2 are constructed as constant current sources. Additional current paths 15, 16 are thus provided, which divert the constant current impressed at the base point 19 to the supply voltage VCC in dependence upon the respective component of the local oscillator signal LO, LOX. The emitter of the transistor 11 of one branch of the difference amplifier 1 is coupled with the emitter of an additional transistor forming the current path 15. The collector of the transistor 15 is connected to the terminal for the supply potential VCC. The emitter of the transistor 12 of the other branch of the difference amplifier 1 is connected to the emitter of another transistor forming the current path 16. The collector of the transistor 16 is connected to the terminal for the supply potential VCC. The emitters of the transistors 15 and 16 are only indirectly connected to the current source 3. The current source 3 is connected to the emitters of the transistors 11, 12 by way of respective resistors. The base terminals of the transistors 15, 16 are jointly controlled by the in-phase component LO of the local oscillator signal. In a corresponding manner, respective transistors 25, 26 which are provided for the difference amplifier 2 are controlled by the out-of-phase component LOX of the local oscillator signal. The transistors 25, 26 are connected on one hand to the emitter terminals of the difference amplifier transistors 21, 22 and on the other hand to the supply potential VCC. The difference amplifier transistors 21, 22 are directly connected to the current source 4 by way of respective resistors.

While the current sources 3, 4 in FIG. 2 deliver a constant direct current, the currents are switched away from the respective difference amplifier transistors 11, 12 and 21, 22 and diverted to the supply potential VCC in dependence upon control by the components LO, LOX of the local oscillator signal. The transistors 15, 16 and 25, 26 which respectively form bypass paths act as emitter follower transistors. For instance, when the signal LO has a high level, the transistors 15, 16 raise the emitter potential of the transistors 11, 12 enough to block the transistors 11, 12 during the high phase of the signal LO. The current which is impressed by the current source 3 is then kept away from the transistors 11, 12 and diverted by way of the transistors 15, 16. The transistors 25, 26 in the difference amplifier 2 are controlled by the signal LOX in counterphase with the signal LO. This achieves the same effect as the circuit of FIG. 1, namely that only the current through the difference amplifier 1 or the current through the difference amplifier 2 becomes active in the output signal OUT, OUTX, in alternation. The switching speed of the circuit in the embodiment of FIG. 2 is expediently higher than that in the embodiment of FIG. 1. Due to the steeper switching edges, the noise behavior of the amplifier is improved, i.e. the noise portion in the output signal OUT, OUTX is reduced.

In the embodiment represented in FIG. 3, the difference amplifiers 1, 2 share a common node or base point 39. The transistors 11, 12 of the first difference amplifier 1 are thus coupled to the node 39 through respective resistors 37 and 38. The transistors 21, 22 of the difference amplifier 2 are likewise coupled to the node 39 by way of resistors 37 and 38. The node 39 is connected to the reference potential VEE by way of a single constant current source 34. The base terminals of the transistors 11, 21 are controlled by the signal component BB, and the base terminals of the transistors 12, 22 are controlled by the signal component BBX. Respective resistors 71, 72 and 73, 74 are provided for decoupling the base terminals. The collector terminals of the transistors are cross-coupled. The collectors of the transistors 21, 12 are thus jointly connected to the resistor 6, and the collectors of the transistors 11, 22 are jointly connected to the resistor 5. The components LO, LOX of the local oscillator signal are applied to the base terminals of the transistors by way of capacitive elements. The signal LO is applied to the base terminals of the transistors 11, 12 of the difference amplifier 1 by way of respective capacitors 45, 46, and the signal LOX is applied to the base terminals of the transistors 21, 22 of the difference amplifier 2 by way of respective capacitors 47, 48.

As opposed to the embodiment of FIG. 2, the transistors of the activated difference amplifier of FIG. 3 serve as bypass transistors for the other difference amplifier. The components LO, LOX of the local oscillator signal are coupled to the base terminals of the transistors 11, 12, 21, 22 by way of the capacitive elements 45, 46, 47, 48. Given a low level, for instance of the signal LO, the base potential of the transistors 11, 12 is lowered enough to block the transistors 11, 12, as a result of which the current impressed by the current source 34 flows only over the transistors 21, 22 of the difference amplifier 2. Meanwhile, the signal LOX has an H level, so that the base potential of the transistors 21, 22 is raised in such a way that they are reliably conductive. Correspondingly inverse relations prevail when the signal LO has a high level. The difference amplifier having the lower instantaneous base potentials is deactivated, and the difference amplifier with the higher instantaneous base potentials conducts the current. Ultra-high-speed switching behavior is achieved by these measures as well.

The resistors 71, 72, 73, 74 can also be replaced by inductors. The signals LO, LOX are then supplied with the aid of coupled coils (transformers) instead of the capacitors 45, 46, 47, 48. Only one current source is required, which saves current.

Figure 4:
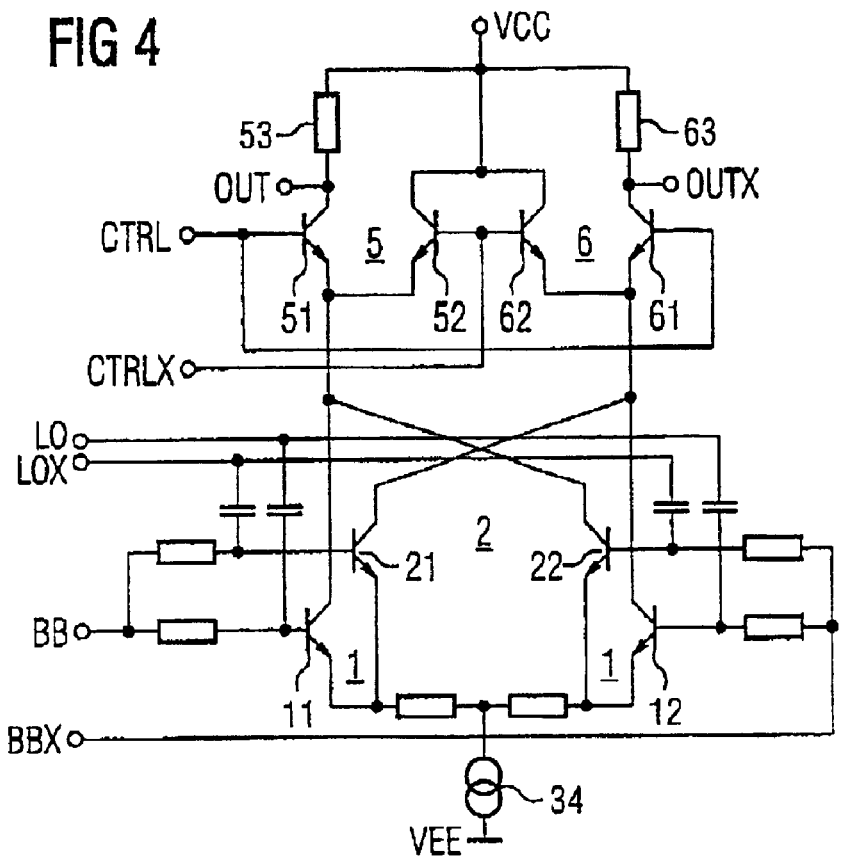
FIG. 4 is a schematic diagram of an embodiment including a single current source and variable amplification adjustment.

The mixer represented in FIG. 4 is based on the mixer represented in FIG. 3, whereby the loads 5, 6 are active in order to effectuate an amplification which is adjustable through the use of complementary components of a control signal CTRL, CTRLX. A difference amplifier 6 including first and second emitter-coupled transistors 61, 62 is connected to one of the output-side coupling nodes of the difference amplifiers 1, 2, while another difference amplifier 5 including first and second emitter-coupled transistors 51, 52 is connected to the other output-side coupling node of the difference amplifier 1, 2. The base terminals of the transistors 51, 61 are controlled by the control signal CTRL. The base terminals of the transistors 52, 62 are controlled by the complementary control signal CTRLX. The collector terminals of the first transistors 51, 61 are connected to the supply potential VCC by way of respective resistors 53 and 63, at which the output signals OUT and OUTX can be tapped. The collectors of the second transistors 52, 62 are coupled to one another and connected directly to the supply potential VCC. The complementary components CTRL, CTRLX of the control signal provide a continuous adjustment of the amplification of the mixer. For instance, as the level of the control signal component CTRL drops, the control signal component CTRLX rises, so that current through the transistors 51, 61 is more intensively redirected into the branches of the transistors 52, 62 and diverted directly to the supply potential VCC. In this way, the level at the load resistors 53, 63 drops, and with it the amplification. Thus, through the use of the control signal CTRL, CTRLX the load current can be pulled from the current path through the load resistors 53, 63 and diverted directly to the supply potential VCC.

Although the exemplary embodiments include bipolar npn-transistors, the circuits can also be realized with n-MOS transistors. However, an embodiment with transistors of the other polarity, i.e. pnp transistors or p-MOS transistors, is also possible. A current source can be constructed from a transistor and respective negative feedback resistors on the emitter and source sides.

I claim:

1. A circuit configuration for mixing a desired signal with an oscillator signal, comprising:

terminals for the desired signal to be supplied with a first signal component and a complementary second signal component of the desired signal;

terminals for the oscillator signal to be supplied with a first signal component and a complementary second signal component of the oscillator signal;

first and second difference amplifiers each including a coupling node and first and second branches, said branches each having first and second terminals and a transistor;

resistors each having a first terminal connected to said first terminal of a respective one of said branches and a second terminal connected to a respective one of said coupling nodes, and current sources each connected between a respective one of said coupling nodes and a terminal for a reference potential;

said transistors of said first branches of said difference amplifiers having control terminals controlled by the first component of the desired signal, and said transistors of said second branches of said difference amplifiers having control terminals controlled by the second component of the desired signal;

load elements each connecting said second terminal of said first branch of one of said difference amplifiers and said second terminal of said second branch of another of said difference amplifiers together to a terminal for a supply potential; and additional transistors each to be controlled by a respective one of the signal components of the oscillator signal, said additional transistors each connected between the terminal for the supply potential and said first terminal of a respective one of said resistors of said branches of said difference amplifiers.

2. The circuit configuration according to claim 1, wherein said current sources are constant current sources.

3. A circuit configuration for mixing a desired signal with an oscillator signal, comprising:

terminals for the desired signal to be supplied with a first signal component and a complementary second signal component of the desired signal;

terminals for the oscillator signal to be supplied with a first signal component and a complementary second signal component of the oscillator signal;

first and second difference amplifiers each including a coupling node and first and second branches, said branches each having first and second terminals and a transistor;

resistors each having a first terminal connected to said first terminal of a respective one of said branches and a second terminal connected to a respective one of said coupling nodes, and current sources each connected between a respective one of said coupling nodes and a terminal for a reference potential, each of said current sources being a switchable current source with an impressible current to be controlled in dependence upon a respective one of the components of the oscillator signal;

said transistors of said first branches of said difference amplifiers having control terminals controlled by the first component of the desired signal, and said transistors of said second branches of said difference amplifiers having control terminals controlled by the second component of the desired signal; and load elements each connecting said second terminal of said first branch of one of said difference amplifiers and said second terminal of said second branch of another of said difference amplifiers together to a terminal for a supply potential.

4. The circuit configuration according to claim 3, including capacitive elements each connected between one of said terminals for the oscillator signal and the control terminal of a respective one of said transistors of said difference amplifiers, said coupling nodes of said first and second difference amplifiers being in the form of a shared common coupling node.

5. The circuit configuration according to claim 3, wherein said load elements each have difference amplifiers and first and second branches, additional load elements are each connected between a respective one of said first branches and the terminal for the supply potential, said second branches have load sides coupled to each other and connected to the terminal for the supply potential, and said first and second branches are jointly controllable by respective control signals.

6. The circuit configuration according to claim 3, wherein said current sources of said difference amplifiers are formed by a common current source connecting said coupling node to the terminal for the reference potential.

* * * * *